United States Patent [19]

Ota et al.

[11] Patent Number: 4,916,709

[45] Date of Patent: Apr. 10, 1990

[54] SEMICONDUCTOR LASER DEVICE

[75] Inventors: Yoichiro Ota; Tetsuya Yagi, both of Itami, Japan

[73] Assignee: Mitsubishi Denki Kabushiki Kaisha, Japan

[21] Appl. No.: 322,178

[22] Filed: Mar. 13, 1989

[30] Foreign Application Priority Data

Mar. 16, 1988 [JP] Japan .................................. 63-64221

[51] Int. Cl.$^4$ ............................................. H01S 3/19
[52] U.S. Cl. ....................................... 372/46; 372/45; 357/16; 357/17
[58] Field of Search ...................... 372/46, 45, 47, 44, 372/43; 357/17, 16

[56] References Cited

U.S. PATENT DOCUMENTS 4,667,332  5/1987  Mihashi et al. ...................... 372/45
4,821,278  4/1989  Yang et al. ............................ 372/46
4,847,845  7/1989  Omura et al. ......................... 372/46

FOREIGN PATENT DOCUMENTS 0207690  12/1983  Japan ...................................... 372/46

OTHER PUBLICATIONS

Mawst et al., "Complementary Self-Aligned Laser By Metalorganic Chemical Vapor Deposition", Electronics Letters., vol. 21, No. 20, Sep. 26, 1985, pp. 903–905.

Primary Examiner—William L. Sikes
Assistant Examiner—Georgia Y. Epps
Attorney, Agent, or Firm—Leydig, Voit & Mayer

[57] ABSTRACT

A semiconductor laser device includes an active layer, a pair of different conductivity type cladding layers having a wider energy band gap than that of the active layer, sandwiching the active layer. One of the cladding layers has a stripe ridge or stripe groove. A high dopant concentration diffusion region having the same conductivity type as that of the cladding layer is disposed on the stripe ridge or the stripe groove. Therefore, a refractive index difference is provided in the two directions transverse to the length of the resonant cavity and a low astigmatism. Furthermore, because the light confinement is strengthened, the light emission efficiency is also enhanced.

8 Claims, 2 Drawing Sheets

SEMICONDUCTOR LASER DEVICE

FIELD OF THE INVENTION

The present invention relates to a semiconductor laser device and, more particularly, to a laser having reduced astigmatism.

BACKGROUND OF THE INVENTION

FIG. 3 shows a prior art semiconductor laser device which is disclosed in J. Appl. Phys. 60(7), 2633(1986).

In FIG. 3, an n type $Al_xGa_{1-x}As$ ($0 \leq x \leq 0.60$) lower cladding layer 2 having carrier concentration of about $10^{17}$ cm$^{-3}$ is disposed on an n type GaAs substrate 1. A p type or n type $Al_yGa_{1-y}As$ ($0 \leq y \leq 0.45$ and $y < x$) active layer 3 having a carrier concentration of about $10^{17}$ cm$^{-3}$ is disposed on the n type $Al_xGa_{1-x}As$ lower cladding layer 2. A p type $Al_xGa_{1-x}As$ upper cladding layer 4 having a carrier concentration of about $10^{17}$ to $10^{18}$ cm$^{-3}$ is disposed on the p type or n type $Al_yGa_{1-y}As$ active layer 3. An n type GaAs blocking layer 6 is disposed on the p type $Al_xGa_{1-x}As$ upper cladding layer 4. A p type GaAs contact layer 7 is disposed on a stripe ridge portion 9 of the p type $Al_xGa_{1-x}As$ upper cladding layer 4. Reference numerals 10 and 11 designate an n side and p side electrode, respectively.

The production process of the device will be described.

First, an n type $Al_xGa_{1-x}As$ lower cladding layer 2, an active layer 3, a p type upper cladding layer 4, and a contact layer 7 are epitaxially grown on an n type GaAs substrate 1. Thereafter, the upper cladding layer 4 and the contact layer 7 are wet etched using for example a mixed solution of hydrogen peroxide, ammonia, and water, thereby producing a stripe ridge comprising the upper cladding layer 4 and the contact layer 7. The inclination of the exposed side surface of the stripe ridge can be controlled to a desired value by selecting a proper etching solution. In this case the angle is desirably 54.5°. Thereafter, n type current blocking layers 6 are grown on the exposed surfaces of the upper cladding layer 4. Thereafter, an n side electrode 10 and a p side electrode 11 are produced on the n type GaAs substrate 1 and on the exposed surface of the p type contact layer 7 and the n type blocking layers 6, respectively.

The device will operate as follows.

When a negative and positive voltages are respectively applied to the n side and p side electrodes 10 and 11, a current flows predominantly through the ridge portion 9. Then, in the active layer 3 the neighborhood of the ridge portion 9, electrons and holes are respectively injected into the active layer 3 and light emission occurs due to the recombination of electrons and holes. When the injection current is increased above a threshold current, stimulated emission starts and laser oscillation occurs.

In the prior art semiconductor laser of such a construction, however, vertical transverse mode oscillation, i.e., the mode perpendicular to the interface between the substrate and the lower cladding layer, is controlled by the refractive index waveguide structure created by the differences in refractive indices of layers 2, 3, and 4. On the other hand, horizontal transverse mode oscillation, i.e., the mode parallel to the interface between the substrate and the lower cladding layer, is controlled by the effective refractive index difference, that is the, so-called rib waveguide. Although the device of FIG. 3 is of a refractive index type, there is no built-in refractive index difference in the horizontal direction.

Accordingly, this device has a higher astigmatism than a device having built-in refractive index differences in both the vertical and horizontal directions, although it has a less astigmatism than the gain waveguide laser. Herein, the refractive index waveguide laser generally has less astigmatism than the gain waveguide laser because the light emitted from the refractive index waveguide laser begins to be broaden where the light is entirely reflected inside the crystal and the light is emitted having parallel wave fronts.

SUMMARY OF THE INVENTION

It is an object of the present invention to provide a semiconductor laser device having low astigmatism, that is, capable of focusing an image on a minute spot.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to the present invention, a high impurity concentration diffusion region having the same conductivity type as that of the cladding layer is provided in the cladding layer along at least a ridge portion or a stripe groove. Therefore, a refractive index difference exists between the high impurity concentration diffusion region in the cladding layer and the other region thereof, thereby effectively confining the light in the cladding layer along the ridge portion or the stripe groove.

DETAILED DESCRIPTION OF THE PREFERRED EMBODIMENTS

An embodiment of the present invention will be described in detail with reference to the drawings.

Figure 1:
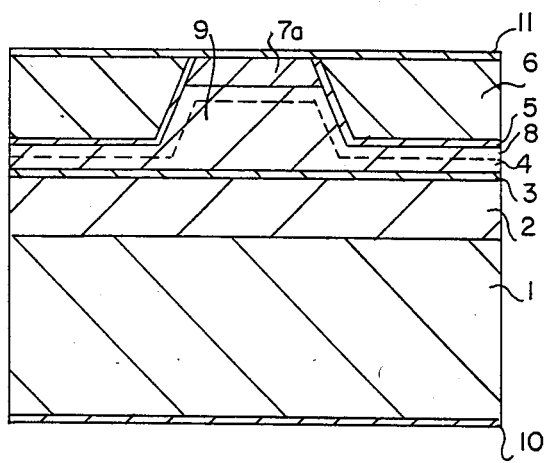
FIG. 1 is a cross-sectional view of a semiconductor laser device according to an embodiment of the present invention.
Figure 3:
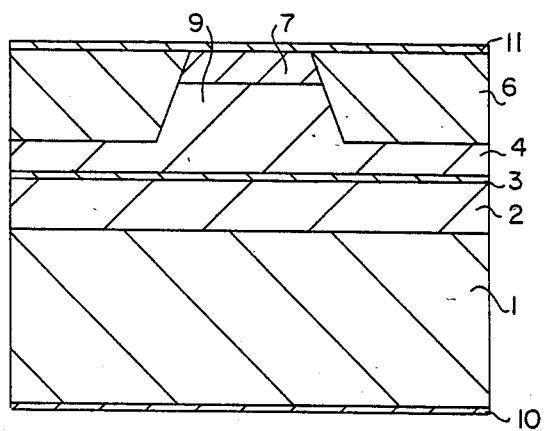
FIG. 3 is a cross-sectional view of a semiconductor laser device according to the prior art.

FIG. 1 is a cross-sectional view of a semiconductor laser device according to an embodiment of the present invention. In FIG. 1, an n type $Al_xGa_{1-x}As$ ($0 \leq x \leq 0.60$) lower cladding layer 2 having a carrier concentration of about $1 \times 10^{17}$ cm$^{-3}$ is disposed on the n type GaAs substrate 1. A p type or n type $Al_yGa_{1-y}As$ ($0 \leq y \leq 0.45$ and $y < x$) active layer 3 having carrier concentration of about $6 \times 10^{17}$ cm$^{-3}$ is disposed on the n type $Al_xGa_{1-x}As$ lower cladding layer 2. A p type $Al_xGa_{1-x}As$ upper cladding layer 4 having a carrier concentration of about $10^{17}$ to $10^{18}$ cm$^{-3}$ is disposed on the p type or n type $Al_yGa_{1-y}As$ active layer 3. A p type dopant diffusion region 8 having a carrier concentration of about $10^{18}$ to $10^{19}$ cm$^{-3}$ is produced in the upper region of the upper cladding layer 4. A p type GaAs contact layer 7a having a carrier concentration of about $1\times10^{19}$ cm$^{-3}$ is disposed on the stripe ridge portion 9 of the upper cladding layer 4. p type GaAs buffer layers 5 having a carrier concentration of about $1\times10^{19}$ cm$^{-3}$ are disposed on the p type dopant diffusion region 8. N type GaAs blocking layers 6 having a carrier concentration of about $8\times10^{18}$ cm$^{-3}$ are disposed on the buffer layers 5. Reference numerals 10 and 11 designate n side and p side electrodes, respectively.

The production process will be described.

First, an n type Al$_x$Ga$_{1-x}$As lower cladding layer 2, a p type or n type Al$_y$Ga$_{1-y}$As active layer 3, a p type Al$_x$Ga$_{1-x}$As upper cladding layer 4, and a p type GaAs contact layer 7a are successively epitaxially grown on the n type substrate 1. Thereafter, both sides of the upper cladding layer 4 and the p type contact layer 7a are etched for example, with a mixed solution of hydrogen peroxide, ammonia, and water. P type buffer layers 5 and n type current blocking layers 6 are grown on the side etched surfaces of the upper cladding layer 4 and the p type contact layer 7a. In order to produce the p type dopant diffusion region 8 in the upper cladding layer 4, it is only required to dope the upper cladding layer 4 with zinc to a carrier concentration of about $10^{17}$ to $10^{18}$ cm$^{-3}$ and to dope the buffer layers 5 and the contact layer 7a with zinc to a concentration of about $10^{19}$ cm$^{-3}$. Then, while growing the current blocking layers 6, the atoms dopant in the layers are diffused to produce the p type dopant diffusion region 8 along the upper surface of the upper cladding layer 4. In the p type GaAs series semiconductor, the refractive index is lowered as the carrier concentration is increased to a value larger than or equal to $10^{18}$ cm$^{-3}$ even when the composition ratios are the same (For example, H.C.Casey, "Heterostructure Lasers", Academic Press(1978), 944). Accordingly, the refractive index of the p type dopant diffusion region 8 is made lower than that of the upper cladding layer 4 at the periphery of the region 8, resulting in a built-in refractive index difference.

The device will operate as follows.

When negative and positive voltages are respectively applied to the n side and p side electrodes 10 and 11, a current flows predominantly through the ridge portion 9. Then, at a portion of the active region 3 in the neighborhood of the ridge portion 9, electrons and holes are respectively injected into the active layer 3 from the lower cladding layer 2 and from the upper cladding layer 4. Light emission occurs due to the recombination of electrons and holes. When the injection current is increased, stimulated emission starts and laser oscillation occurs. In the semiconductor laser of the present invention, the light straying into to the upper cladding layer 4 is confined by the built-in refractive index difference between the non-diffusion region and the p type dopant diffusion region 8 of the ridge portion 9. Accordingly, relative to the case where the waveguiding is effected only by the so-called rib waveguide as in the prior art device, the horizontal transverse mode is oscillation is controlled similarly to that of vertical transverse mode oscillation. Therefore, the astigmatism is lowered. Furthermore, because the light confinement is strengthened, the light emission efficiency is also enhanced.

While in the above-illustrated embodiment the present invention is applied to a semiconductor laser device which has blocking layers 6 at both sides of the stripe ridge 9 above the active layer 3, the present invention may be also applied to a semiconductor laser device having blocking layers at both sides of a stripe groove below the active layer 3.

Figure 2:
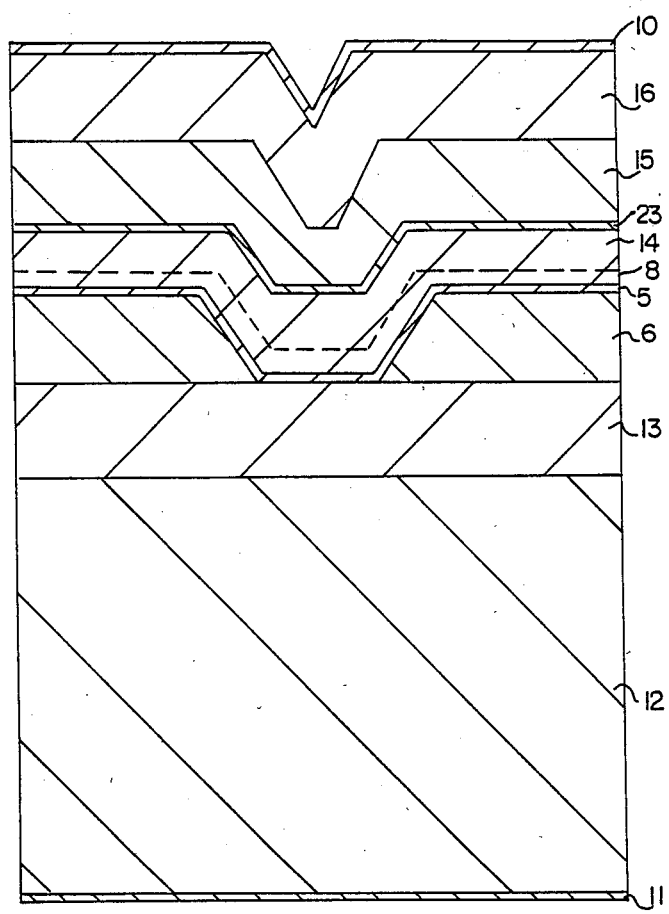
FIG. 2 is a cross-sectional view of a semiconductor laser device according to a second embodiment of the present invention.

FIG. 2 shows a second embodiment of the present invention having such a construction. In FIG. 2, a p type Al$_x$Ga$_{1-x}$As first lower cladding layer 13 is disposed on a p type GaAs substrate 12. N type GaAs current blocking layers 6 are disposed on the p type first lower cladding layer 13. A p type Al$_x$Ga$_{1-x}$As second lower cladding layer 14 is disposed on the current blocking layers 6 and the exposed surface of the first lower cladding layer 13 with an interposed buffer layer 5. An active layer 23 is disposed on the second lower cladding layer 14. An n type Al$_x$Ga$_{1-x}$As upper cladding layer 15 is disposed on the active layer 23. An n type GaAs contact layer 16 is disposed on the upper cladding layer 15. Reference numerals 10 and 11 designate n side and p side electrodes, respectively.

The production process will be described.

First, a p type AlGaAs first cladding layer 13 and an n type current blocking layer 6 are grown on a p type GaAs substrate 12. Thereafter, the current blocking layer 6 is wet etched to produce an aperture through the current blocking layer 6. Thereafter, a buffer layer 5, a second lower cladding layer 14, an active layer 23, an n type upper cladding layer 15, and an n type GaAs contact layer 16 are epitaxially grown on the current blocking layer 6 and the exposed surface of the p type AlGaAs first cladding layer 13. During this epitaxial growth, the impurities included in the buffer layer 5 diffuses into the lower cladding layer 14 thereby to produce a p type dopant diffusion region 8 in the lower portion of the second lower cladding layer 14. This p type dopant diffusion region 8 is produced along the stripe groove in the current blocking layer 6. Thereafter, a p side electrode 11 and an n side electrode 10 are produced on the p type GaAs substrate 12 and on the n type GaAs contact layer 16, respectively.

Also in this laser device having a p type dopant diffusion region along the stripe groove, a built-in refractive index difference is produced by the p type dopant diffusion region 8, and a low astigmatism and a high light emission efficiency are obtained.

While in the above-illustrated embodiment zinc is used as the p type dopant for producing diffusion regions 8, other dopants may used. Furthermore, n type dopants may be also be used.

As discussed above, according to the present invention, a high dopant concentration diffusion region of the same conductivity type as that of the cladding layer is provided at least along a ridge portion or a stripe groove in the cladding layer. Therefore, a refractive index difference can be provided in the transverse direction in the cladding layer, and therefore, the control of the horizontal transverse mode, i.e., the mode parallel to the interface of the substrate and the first cladding layer is achieved similarly to that of the vertical transverse mode, i.e., the mode perpendicular to the interface of the substrate and the first cladding layer. As a result, a semiconductor laser device having a low astigmatism and high light emission efficiency is obtained.

What is claimed is:

1. A semiconductor laser device comprising:
   a semiconductor substrate of a first conductivity type;
   a first cladding layer of the first conductivity type disposed on the substrate;
   an active layer disposed on the first cladding layer;
   a second cladding layer of a second conductivity type disposed on the active layer and including a stripe ridge having a top surface, two generally opposite side surfaces oblique to and adjoining the top surface, and two lower surfaces generally parallel to the top surface adjoining the respective side surfaces and a high dopant concentration diffusion region of the second conductivity type disposed adjacent the top, side, and lower surfaces opposite the active layer;

current blocking layers of the first conductivity type disposed on the side and lower surfaces of the stripe ridge;

a contacting layer of the second conductivity type disposed on the top surface; and first and second electrodes disposed on the substrate and contacting layers, respectively.

2. A semiconductor laser device as defined in claim 1 comprising a buffer layer of the second conductivity type disposed between said diffusion region and said current blocking layers.

3. A semiconductor laser device as defined in claim 1 wherein the energy band gaps of the first and second cladding layers are larger than the energy band gap of the active layers.

4. A semiconductor laser device as defined in claim 1, wherein said active layer comprises $Al_yGa_{1-y}As$ ($0 \leq y \leq 0.45$) and said first and second cladding layers comprise $Al_xGa_{1-x}As$ ($0 \leq x \leq 0.60$ and $y < x$).

5. A semiconductor laser device comprising:
a semiconductor substrate of a first conductivity type;
a first cladding layer of the first conductivity type disposed on the substrate;
a current blocking layer of a second conductivity type disposed on the first cladding layer and including a first groove extending through the current blocking layer to said first cladding layer;
a second cladding layer of the first conductivity type disposed on the current blocking layer and on the first cladding layer in the first groove, the second cladding layer including a second groove and a high dopant concentration region of the first conductivity type disposed adjacent the current blocking layer and adjacent the first cladding layer in the first groove;
an active layer disposed on the second cladding layer;
a third cladding layer of the second conductivity type disposed on the active layer;
a contacting layer of the second conductivity type disposed on the third cladding layer; and
first and second electrodes disposed on the substrate and contacting layer, respectively.

6. A semiconductor laser device as defined in claim 5 comprising a buffer layer of the first conductivity type disposed between the high dopant concentration diffusion region and the current blocking layer and between the high dopant concentration diffusion region and the first cladding layer.

7. A semiconductor laser device as defined in claim 5 wherein the energy band gaps of the second and third cladding layers are larger than the energy band gap of the active layer.

8. A semiconductor laser device as defined in claim 5, wherein said active layer comprises $Al_yGa_{1-y}As$ ($0 \leq y \leq 0.45$) and said upper and lower cladding layers comprise $Al_xGa_{1-x}As$ ($0 \leq x \leq 0.60$ and $y < x$).

* * * * *